United States Patent
Dietz et al.

(10) Patent No.: US 7,250,765 B2
(45) Date of Patent: Jul. 31, 2007

(54) MAGNETIC RESONANCE DEVICE WITH ATTACHMENT MEANS FOR ATTACHING A GRADIENT COIL, ATTACHMENT MEANS

(75) Inventors: Peter Dietz, Fürth (DE); Thomas Kolbeck, Kalchreuth (DE); Jörg Riegler, Nürnberg (DE); Johann Schuster, Oberasbach (DE); Lothar Schön, Neunkirchen (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/441,317

(22) Filed: May 25, 2006

(65) Prior Publication Data

US 2006/0267589 A1    Nov. 30, 2006

(30) Foreign Application Priority Data

May 31, 2005    (DE)  ...................... 10 2005 025 339

(51) Int. Cl.
*G01V 3/00*    (2006.01)
(52) U.S. Cl. .................................... 324/318
(58) Field of Classification Search ................ 324/307, 324/309, 318
See application file for complete search history.

(56) References Cited

U.S. PATENT DOCUMENTS

| | | | |
|---|---|---|---|
| 5,783,943 A * | 7/1998 | Mastandrea et al. | ........ 324/318 |
| 6,107,799 A | 8/2000 | Sellers et al. | |
| 6,501,275 B1 * | 12/2002 | Westphal | ...................... 324/319 |
| 6,777,936 B2 * | 8/2004 | Schaaf | ........................ 324/318 |
| 6,864,683 B2 * | 3/2005 | Schuster et al. | ............ 324/318 |
| 6,882,152 B2 | 4/2005 | Schuster et al. | |
| 6,894,497 B2 * | 5/2005 | Renz | .......................... 324/318 |

FOREIGN PATENT DOCUMENTS

| | | |
|---|---|---|
| DE | 197 22 481 A1 | 12/1998 |
| DE | 102 28 829 A1 | 1/2004 |
| DE | 103 25 464 A1 | 8/2004 |

* cited by examiner

*Primary Examiner*—Brij Shrivastav
*Assistant Examiner*—Dixomara Vargas

(57) ABSTRACT

Magnetic resonance device with an assembly having a recess, in which a gradient coil unit is attached with at least one attachment means, the attachment means having two members, between which an elastic element is disposed, only one of the members in each instance being in contact with either the gradient coil unit or the assembly, with the attachment means acting as an attachment means having no elastic element in a first attachment state, in which at least a minimum force presses the two members together, in that the two members have stop surfaces, which are in contact with each other due to the minimum force acting on the members compressed elastic element and with the attachment means acting as a spring unit in a second fixing state, in that the elastic element pushes the members apart in the event of forces smaller than the minimum force and causes the attachment means to be fixed in relation to the gradient coil unit and the assembly. This has the advantage that there is no loosening of the attachment means in particular even in the event of thermal fluctuations.

12 Claims, 3 Drawing Sheets

MAGNETIC RESONANCE DEVICE WITH ATTACHMENT MEANS FOR ATTACHING A GRADIENT COIL, ATTACHMENT MEANS

CROSS REFERENCE TO RELATED APPLICATIONS

This application claims priority of German application No. 10 2005 025 339.3 filed May 31, 2005, which is incorporated by reference herein in its entirety.

FIELD OF THE INVENTION

The invention relates to a magnetic resonance device with an assembly having a recess, in which a gradient coil unit is attached with attachment means. The invention also relates to attachment means for such an attachment.

BACKGROUND OF THE INVENTION

Magnetic resonance technology (MR technology) is a known technology, for example for obtaining cross-sectional images of an examination subject using nuclear magnetic resonance signals. Rapidly switched gradient fields, which are generated by a gradient coil unit, are thereby superimposed in a magnetic resonance device on a static basic magnetic field, which is generated by a basic field magnet. The magnetic resonance device also comprises a high-frequency system, which radiates high-frequency signals into the examination subject to trigger magnetic resonance signals and which picks up the triggered magnetic resonance signals. An example of such a high-frequency system is what is referred to as a body coil unit, which allows magnetic resonance signals to be picked up, from which relatively large magnetic resonance images can be created.

The generation of high gradient fields, which are enabled and disabled quickly, results in significant vibration of the gradient coil unit, such that the requirements for the attachment of the gradient coil unit are very stringent, preferably also taking into account the suppression of noise sources.

Hard glass-reinforced plastic GRP wedges are for example used to attach a gradient system in a magnetic resonance device. These wedges are inserted into the annular gap at both ends of the gradient coil unit between the gradient coil unit and the surrounding assembly and secured for example using screws. DE 10325464 A1 discloses a development of such wedges, in which a decoupling layer is provided to decouple the vibration of a gradient coil unit from the MR device.

DE 102 28 829 A1 discloses the use of an annular wedge to attach a gradient coil unit in the shape of a hollow cylinder with conically tapering ends.

SUMMARY OF THE INVENTION

The object of the invention is to create an attachment for a gradient coil, which satisfies the stringent requirements during operation of a magnetic resonance device over a long period of time.

This object is achieved by a magnetic resonance device with an assembly having a recess, in which a gradient coil unit is attached with attachment means, the attachment means having two members, between which an elastic element is disposed, with only one of the members in each instance being in contact with either the gradient coil unit or the assembly, with the attachment means acting as an attachment means having no elastic element in a first attachment state, in which at least a minimum force presses the two members together, in that the two members have stop surfaces, which are in contact with each other due to the minimum force acting on the members [lacuna] compressed elastic element, and with the attachment means acting as a spring unit in a second fixing state, in that the elastic element pushes the members apart in the event of forces smaller than the minimum force and causes the attachment means to be fixed in relation to the gradient coil unit and the assembly.

The object is also achieved by an attachment means according to the claims.

One advantage of the attachment according to the invention is that even if the dimensions of the gradient coil unit or member change due to thermal conditions, loosening of the wedge system is prevented in that the attachment means remain spatially fixed with the aid of the spring force of the elastic element, even in the thermally expanded state. This prevents local working and micro-movement of the wedges, which would cause loosening. The attachment means preferably have a large contact surface both at the gradient coil unit and on the inside of the assembly, to achieve the smallest possible surface pressure. The surface contact of the surfaces of the attachment means should also thereby be maximized as far as possible (conical contact surfaces of the gradient coil unit and the attachment means), to ensure a reliable fix with long-term stability. The transmission of vibration from the gradient coil unit to the external components can also be specifically prevented using the wedge geometry.

Further advantageous embodiments of the invention are characterized by the features of the subclaims.

BRIEF DESCRIPTION OF THE DRAWINGS

One exemplary embodiment of the invention is described below with reference to FIGS. 1 to 4, in which.

DETAILED DESCRIPTION OF THE INVENTION

Figure 1:
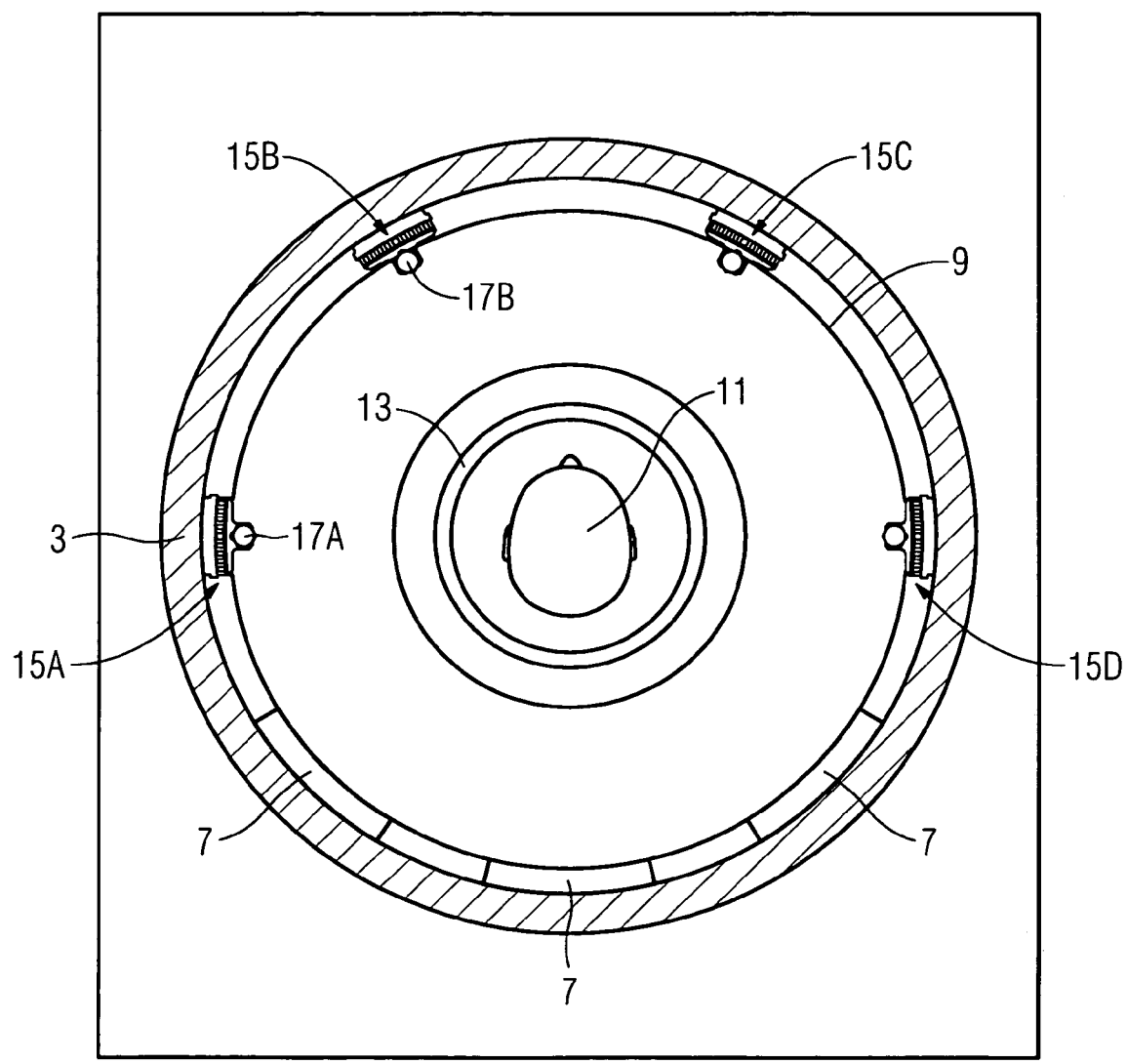
FIG. 1 shows a front view of a magnetic resonance device, in which an insertable gradient coil unit can be integrated using attachment means according to the invention.

FIG. 1 shows a front view of a magnetic resonance device 1 with an assembly 3, for example a basic field magnet of the MR device 1. The assembly 3 encloses an examination area 5, which is configured in a cylindrical manner as a recess in the magnetic resonance device 1. A gradient coil unit 9 is disposed in this recess on layers 7 of an elastic material. The gradient coil unit 9 is for example made of glass fiber in an epoxy resin matrix and copper; the weight of the gradient coil unit is then approx. 750 kg. The gradient coil unit is fixed with the aid of attachment means 15A, . . . 15D, which are disposed in the upper area of the resulting annular gap between the gradient coil unit 9 and the assembly 3 and of which four are shown by way of an example in FIG. 1. For attachment purposes the attachment means 15A, . . . 15D are driven into the gap at both ends of the gradient coil unit 9 and screwed into place with screws 17A such that the attachment means 15A, . . . 15D are jammed between the gradient coil unit 9 and the assembly 3. The jamming effect is preferably reinforced by the wedge-shaped configuration of the attachment means 15A, . . . 15D. The dimensions of the attachment means 15A, . . . 15D are tailored to the thickness of the gap between the gradient coil unit 9 and the body coil unit 3.

When a gradient coil unit 9 is being integrated, it is preferably held by a crane for example. Centering is achieved by adjusting the thickness of the layers 7. The attachments means 15A, . . . , for example configured as wedges, are inserted into the gap until the two members (see FIG. 3) are in contact with each other. If the system comprising the gradient coil unit 9 and surrounding components heats up during operation, this causes distortion and deformation of the components involved. During the cooling process the system expands again, as a result of which the attachment means 15A, . . . may have more space available. As a result of the claimed structure, the spring effect of the elastic element now brings about further fixing of the attachment means (see FIG. 4), such that thermal changes do not cause loosening of the attachment.

Figure 2:
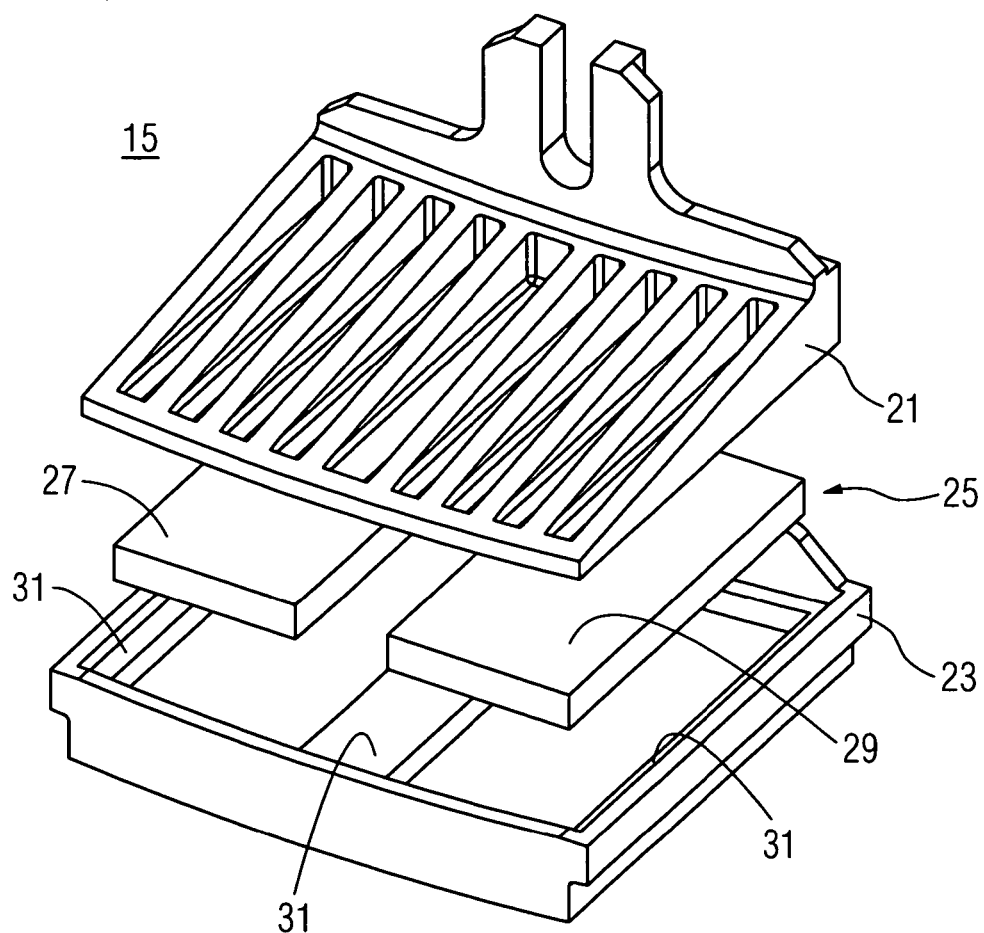
FIG. 2 shows a spatial illustration of a wedge.

FIG. 2 shows a perspective view of an exemplary attachment means 15. It comprises two members 21, 23, made for example of plastic (hard glass-reinforced plastic GRP) or metal, with an elastic element 25 comprising two parts 27 and 29 disposed between them.

The attachment means 15 is preferably made of non-magnetic and non-conductive material, such that it does not influence the magnetic field in the magnetic resonance device 1 and there is no adverse effect on imaging quality.

The member 21 is wedge-shaped with an angle $\alpha$, the angle $\alpha$ being intended to achieve a self-supporting jamming effect, i.e. $\alpha$ is preferably an acute angle. The thickness 27 of the attachment means 15 varies for example between 3 and 20 mm and is tailored to the gap to be bridged. The gradient coil unit 9 and the attachment means 15 are preferably provided with conical surfaces in the contact area to maximize the contact surface.

The elastic element 25 has a thickness and elasticity, which, beyond a minimum force also exercised by the members 21 and 23 on the elastic element 25, are compressed until the members 21 and 23 are in contact with each other at stop surfaces 31. Beyond the minimum force there is therefore no further elastic effect on the part of the attachment means 15, such that the attachment means 15 now acts in the manner of a solid wedge in the event of compression forces greater than the minimum force. The elastic element is for example made of SYLODYN NE, which for example has a working range up to 1.2 N/m2 as a function of its form factor for static and variable loads and has deformations of up to approx. 20% with such compressive loads. The contact surfaces of the members 21, 23 are preferably configured to be as flat as possible for the elastic element 25, in order to be able to utilize the elasticity to the greatest possible degree. To this end the member 21 for example has flat lower side [lacuna] wedge-shaped studs, which form the contact surface with the gradient coil unit 9.

The two-part structure of the elastic element 25 allows a further stop surface to be provided between the parts 27 and 29.

Figure 3:
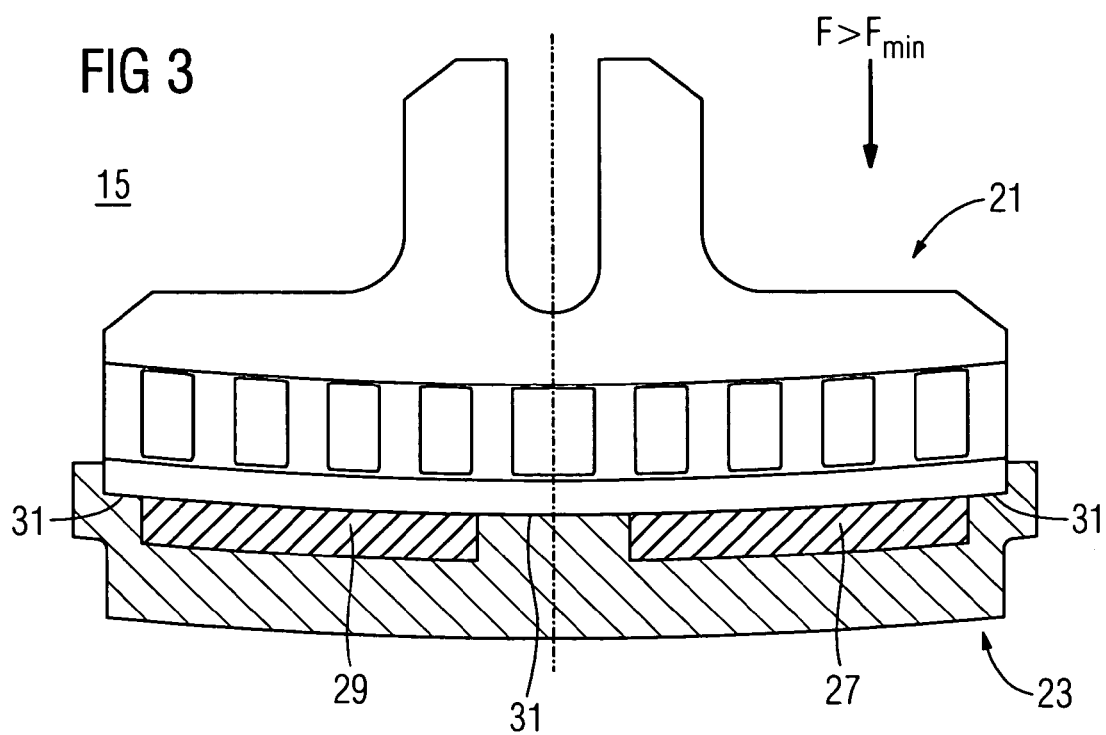
FIG. 3 shows a section through the wedge in FIG. 2 in the attachment state and FIG. 4 shows a section through the wedge in FIG. 2 in the fixing state.

FIG. 3 shows a section through the attachment means 15 in FIG. 2 with a force F, which is greater than the minimum force $F_{MIN}$ and which acts on the members 21 and 23 as they are driven in. It can be seen that in this attachment state of the attachment means 15 the members 21 and 23 are in contact with each other at the stop surfaces 31, such that the attachment means 15 acts as a solid attachment means, i.e. having no elastic element.

Figure 4:
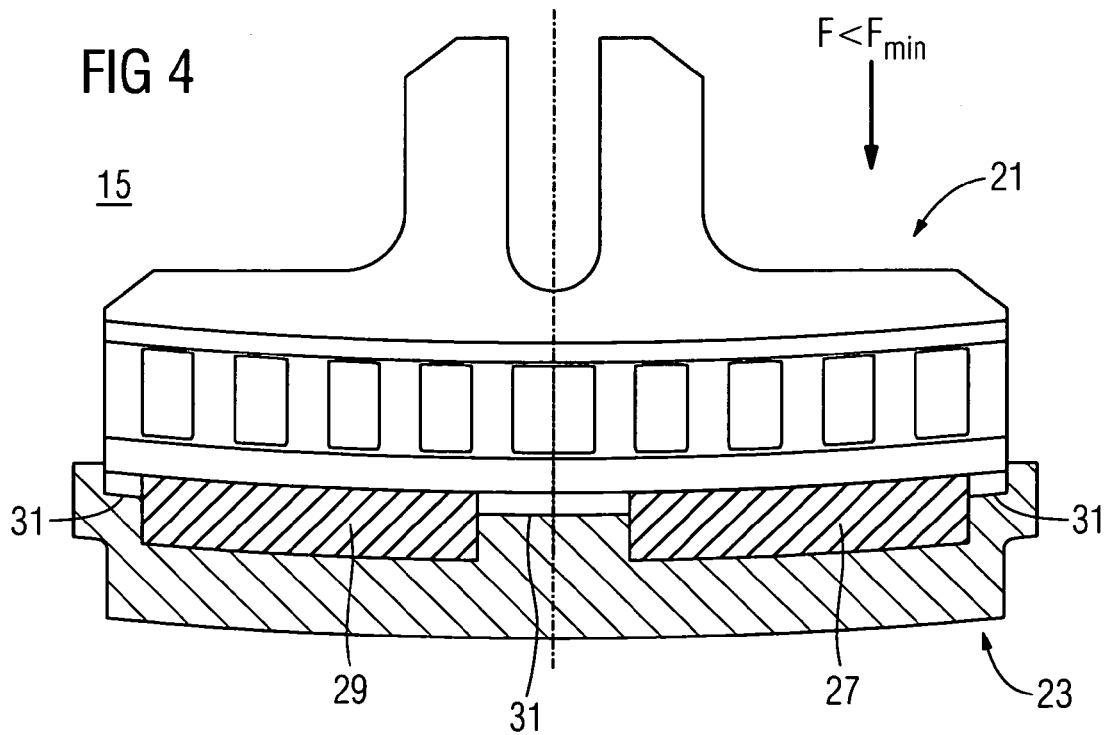

FIG. 4 shows the fixing state of the attachment means, with the acting force F smaller than the minimum force F min. In this instance the elastic element 15, in the exemplary embodiment the elastic sub-areas 27 and 29, has spring forces, which are greater than the acting force F and push the members 21 and 23 apart, such that the members 21, 23 are fixed in relation to the gradient coil unit 9 and the assembly 3.

If the elastic layers 27 and 29 have a thickness of 5 mm for example, a compression of 20% corresponds to 1 mm for example. The elastic element 25 can compress by this amount before the elastic effect of the attachment means 15 is canceled. This spring range of approx. 1 mm roughly corresponds to the observed gap that can occur in the event of thermal changes.

The invention claimed is:

1. A magnetic resonance device, comprising:
   an assembly having a recess;
   a gradient coil unit attached to the recess; and
   an attachment device used to attach the gradient coil unit to the recess, the attachment device comprising,
      two members with one of the members in contact with either the gradient coil unit or the assembly,
      an elastic element disposed between the two elements, and
      a stop surface at which the two members are in contact with each other due to a compressibility of the elastic element,
   wherein in a first attachment state, a minimum force presses the two members of the attachment device together to contact each other at the stop surface if a force is greater than the minimum force, then the attachment device acts as having no elastic element,
   wherein in a second fixing state, the elastic element between the two members of the attachment device pushes the two members apart if the force is smaller than the minimum force, then the attachment device acts as a spring unit and causes the attachment device to be fixed in respect to the gradient coil unit and the assembly.

2. The magnetic resonance device as claimed in claim 1, wherein one of the members is wedge-shaped to attach the gradient coil unit in the assembly by jamming the gradient coil unit ina contact area with the wedge.

3. The magnetic resonance device as claimed in claim 2, wherein the member in contact with the gradient coil unit is conical with the gradient coil unit.

4. The magnetic resonance device as claimed in claim 1, wherein one of the members is screwed to the gradient coil unit or the assembly.

5. The magnetic resonance device as claimed in claim 1, wherein the stop surface is arranged so that the elastic element is deformed within a framework of a working range.

6. The magnetic resonance device as claimed in claim 5, wherein the elastic element is compressed less than 20%.

7. The magnetic resonance device as claimed in claim 1, wherein the elastic element comprises a rubber layer or a closed-cell polyetherurethane layer.

8. The magnetic resonance device as claimed in claim 7, wherein the elastic element has a working range up to 1.2 $N/mm^2$ with a deformation of up to 20%.

9. The magnetic resonance device as claimed in claim 1 wherein the gradient coil unit rests on an elastic support disposed on the assembly, and the attachment device is disposed in an upper area of the assembly.

10. The magnetic resonance device as claimed in claim 1, wherein the assembly is a body coil unit.

11. An attachment device for attaching a gradient coil unit in an assembly of a magnetic resonance device, comprising:
- at least two members with one of the members in contact with either the gradient coil unit or the assembly;
- an elastic element disposed between the at least two elements; and
- a stop surface at which the at least two members are in contact with each other due to a compressibility of the elastic element,
- wherein in a first attachment state, a minimum force presses the at least two members of the attachment device together to contact each other at the stop surface if a force is greater than the minimum force,
- wherein in a second fixing state, the elastic element between the at least two members of the attachment device pushes the at least two members apart if the force is smaller than the minimum force, then the attachment device acts as a spring unit and causes the attachment device to be fixed in respect to the gradient coil unit and the assembly.

12. The attachment device as claimed in claim 11, wherein the attachment device has two members.

* * * * *